(12) United States Patent
Kim (10) Patent No.: US 10,969,892 B2
(45) Date of Patent: Apr. 6, 2021

(54) DISPLAY PANEL (71) Applicant: LG Display Co., Ltd., Seoul (KR)

(72) Inventor: Jangryang Kim, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/668,241

(22) Filed: Oct. 30, 2019

(65) Prior Publication Data
US 2020/0150806 A1 May 14, 2020

(30) Foreign Application Priority Data
Nov. 8, 2018 (KR) .................. 10-2018-0136739

(51) Int. Cl.
G06F 3/041 (2006.01)
G02F 1/13357 (2006.01)
H01L 33/56 (2010.01)

(52) U.S. Cl.
CPC .......... *G06F 3/0412* (2013.01); *G02F 1/1336* (2013.01); *H01L 33/56* (2013.01)

(58) Field of Classification Search
CPC .... G06F 3/0412; G06F 3/0443; G02F 1/1336; H01L 33/56
See application file for complete search history.

(56) References Cited

U.S. PATENT DOCUMENTS

| | | | |
|---|---|---|---|
| 2009/0206162 A1* | 8/2009 | De Cremer | C09K 11/02 235/491 |
| 2016/0158708 A1* | 6/2016 | Lee | B01J 20/226 95/47 |
| 2016/0181565 A1* | 6/2016 | Lee | H01L 51/5246 257/99 |
| 2016/0239133 A1* | 8/2016 | Ko | G06F 3/0412 |
| 2016/0336523 A1* | 11/2016 | Kwon | H01L 27/323 |
| 2017/0147117 A1* | 5/2017 | Song | G06F 3/0443 |
| 2017/0168608 A1* | 6/2017 | Kim | G06F 3/0446 |
| 2017/0186922 A1* | 6/2017 | Kim | C09K 11/703 |
| 2018/0329555 A1* | 11/2018 | Kim | G06F 3/0412 |
| 2018/0351117 A1* | 12/2018 | Kim | H01L 51/5253 |

FOREIGN PATENT DOCUMENTS

KR 10-2011-0103838 A 9/2011
KR 10-2018-0044465 A 5/2018

* cited by examiner

*Primary Examiner* — Carolyn R Edwards
(74) *Attorney, Agent, or Firm* — Polsinelli PC

(57) ABSTRACT

A display panel comprises a light-emission elements array including a plurality of light-emission elements which corresponds to a plurality of pixel regions arranged in a display region; an encapsulating film covering the light-emission elements array; a touch sensor disposed over the encapsulating film; and a touch protective film covering the touch sensor, wherein the touch protective film includes a material containing core-shell structured particles.

19 Claims, 4 Drawing Sheets

DISPLAY PANEL

CROSS REFERENCE TO RELATED APPLICATION

This application claims the priority of Korean Patent Application No. 10-2018-0136739 filed on Nov. 8, 2018, which is hereby incorporated by reference in its entirety.

BACKGROUND

Field of the Disclosure

The present disclosure relates to a display device, and more particularly, to a display device having a display panel with a touch sensor.

Description of the Background

A display device is applied to various electronic devices such as TVs, mobile phones, notebooks and tablets. Therefore, studies are being continued to develop thinner, lighter, and lower power consuming display devices.

Such a display device generally includes a flat display panel including a display region for displaying an image, and a panel driver for driving the display panel.

Representative examples of the display device include a liquid crystal display device (LCD), a plasma display device (PDP), a field emission display device (FED), an electroluminescence display device (ELD), an electro-wetting display device (EWD), and an organic light-emitting display device (OLED).

A display panel of the organic light-emitting display device (OLED) emits light for image display using a light-emitting element. In this connection, since the organic light-emission device is a self-luminous device, the organic light-emission display device may display an image without a separate light source. Accordingly, the organic light-emission display device is advantageous in terms of weight reduction and thinness as compared with a liquid crystal display device.

In order to improve convenience of the user in recent years, the display panel may include a touch sensor for sensing a touch. The touch sensor implements a function of receiving a command from the user by detecting a contact point of a human hand or an object in the display region.

The touch sensor may be disposed adjacent to a display surface of the display panel to prevent sensitivity degradation in the touch sensing. In this case, as the light emitted from the light emitting element is emitted to the outside through a path through the touch sensor, light loss may be caused. Therefore, there is a problem that luminance is inevitably lowered, and therefore there is a limit to improvement in display quality.

SUMMARY

Accordingly, the present disclosure is directed to a display panel that substantially obviates one or more of problems due to limitations and disadvantages of the prior art.

The present disclosure provides a display panel including a touch sensor which improves display quality.

The present disclosure is not limited to the above-mentioned purposes. Other aspects and advantages of the present disclosure, as not mentioned above, may be understood from the following descriptions and more clearly understood from the aspects of the present disclosure. Further, it will be readily appreciated that the purposes and advantages of the present disclosure may be realized by features and combinations thereof as disclosed in the claims.

In one aspect of the present disclosure, there is proposed a display panel comprising: a light-emission elements array including a plurality of light-emission elements respectively corresponding to a plurality of pixel regions arranged in a display region; an encapsulating film covering the light-emission elements array; a touch sensor disposed above the encapsulating film; and a touch protective film covering the touch sensor, wherein the touch protective film comprises a material containing core-shell structured particles dispersed therein.

In one implementation, each of the core-shell structured particles includes: a core comprising a metal oxide; and a shell formed of a molecular sieve surrounding the core.

In one implementation, the metal oxide comprises an oxide containing Ti or Fe, wherein the molecular sieve comprises MCM-41 or SBA-15.

In one implementation, the material of the touch protective film further contains at least one binder and a photosensitive agent, wherein the touch protective film has adhesiveness due to the at least one binder.

In one implementation, the binder includes at least one of an alkali developable binder and a silicon based binder, wherein the photosensitive agent includes an oxime compound or a benzophenone compound.

In one implementation, the display panel further comprises a polarizing film attached to the touch protective film and having an area corresponding to the display region.

In one implementation, the touch sensor includes: a touch interlayer insulating film disposed above the encapsulating film; a first touch electrode including: a plurality of first electrode patterns disposed above the touch interlayer insulating film and arranged in a first direction; and a plurality of first bridges, each first bridge connecting first electrode patterns adjacent to each other in the first direction; and a second touch electrode including: a plurality of second electrode patterns disposed above the touch interlayer insulating film and spaced from the first electrode and arranged in a second direction perpendicular to the first direction; and a plurality of second bridges, each second bridge connecting second electrode patterns adjacent to each other in the second direction, wherein the first bridge is disposed above the touch interlayer insulating film, wherein each second bridge is disposed above the encapsulating film and is covered with the touch interlayer insulating film, wherein each second bridge is connected to each second electrode pattern via a contact hole vertically passing through the touch interlayer insulating film.

According to one aspect of the present disclosure, the touch sensor is disposed above the encapsulating film covering the light-emission elements array. The touch protective film covering the touch sensor comprises the material containing the core-shell structured particles. Each of the core-shell structured particles includes a core comprising a metal oxide and a shell comprising a molecular sieve and surrounding the core. In one example, the molecular sieve may comprise MCM-41 or SBA-15. As the molecular sieve has a hexagonal columnar structure, the light can pass through pores in the molecular sieve such that the linearity of the light is enhanced. In addition, since the core comprises the metal oxide having a relatively high refractive index, the light transmittance of the touch protective film can be improved.

As a result, the light extraction efficiency at which light from the light-emission elements array is discharged to the outside can be improved by the touch protective film comprising the material containing the core-shell structured particles dispersed therein.

Accordingly, the display panel according to an aspect of the present disclosure may minimize the degradation of brightness due to the light extraction efficiency enhanced by the touch protective film while including the touch sensor. As a result, the display quality of the organic light-emission display device can be improved and power consumption thereof can be reduced.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings.

DETAILED DESCRIPTION

For simplicity and clarity of illustration, elements in the figures are not necessarily drawn to scale. The same reference numbers in different figures denote the same or similar elements, and as such perform similar functionality. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

Examples of various aspects are illustrated and described further below. It will be understood that the description herein is not intended to limit the claims to the specific aspects described. On the contrary, it is intended to cover alternatives, modifications, and equivalents as may be included within the spirit and scope of the present disclosure as defined by the appended claims.

The terminology used herein is for the purpose of describing particular aspects only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements may modify the entire list of elements and may not modify the individual elements of the list.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a display panel according to an aspect of the present disclosure and an organic light-emission display device including the display panel will be described in detail with reference to the accompanying drawings.

Figure 1:
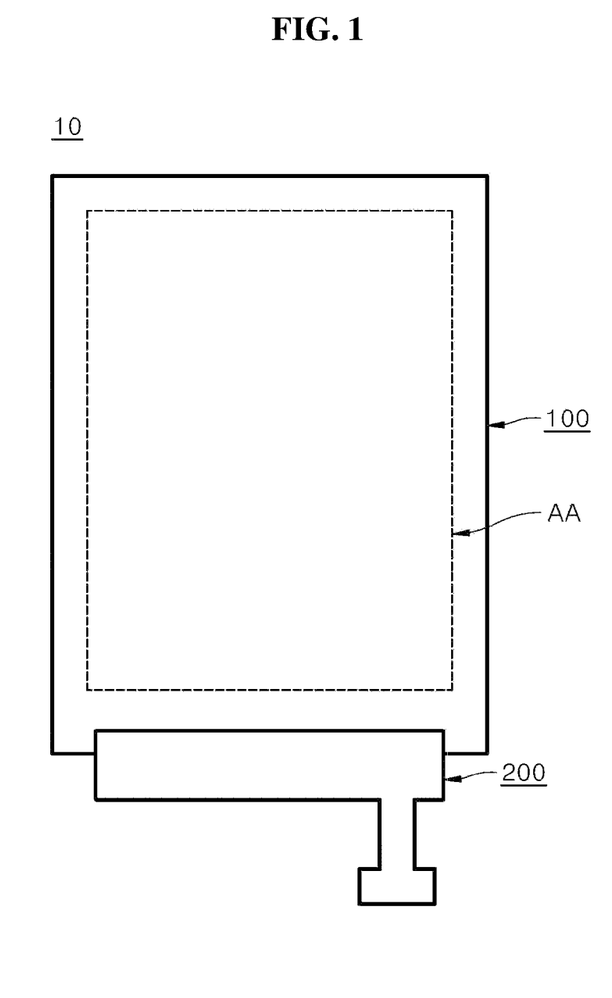
FIG. 1 shows an organic light-emission display device according to one aspect of the present disclosure.
Figure 2:
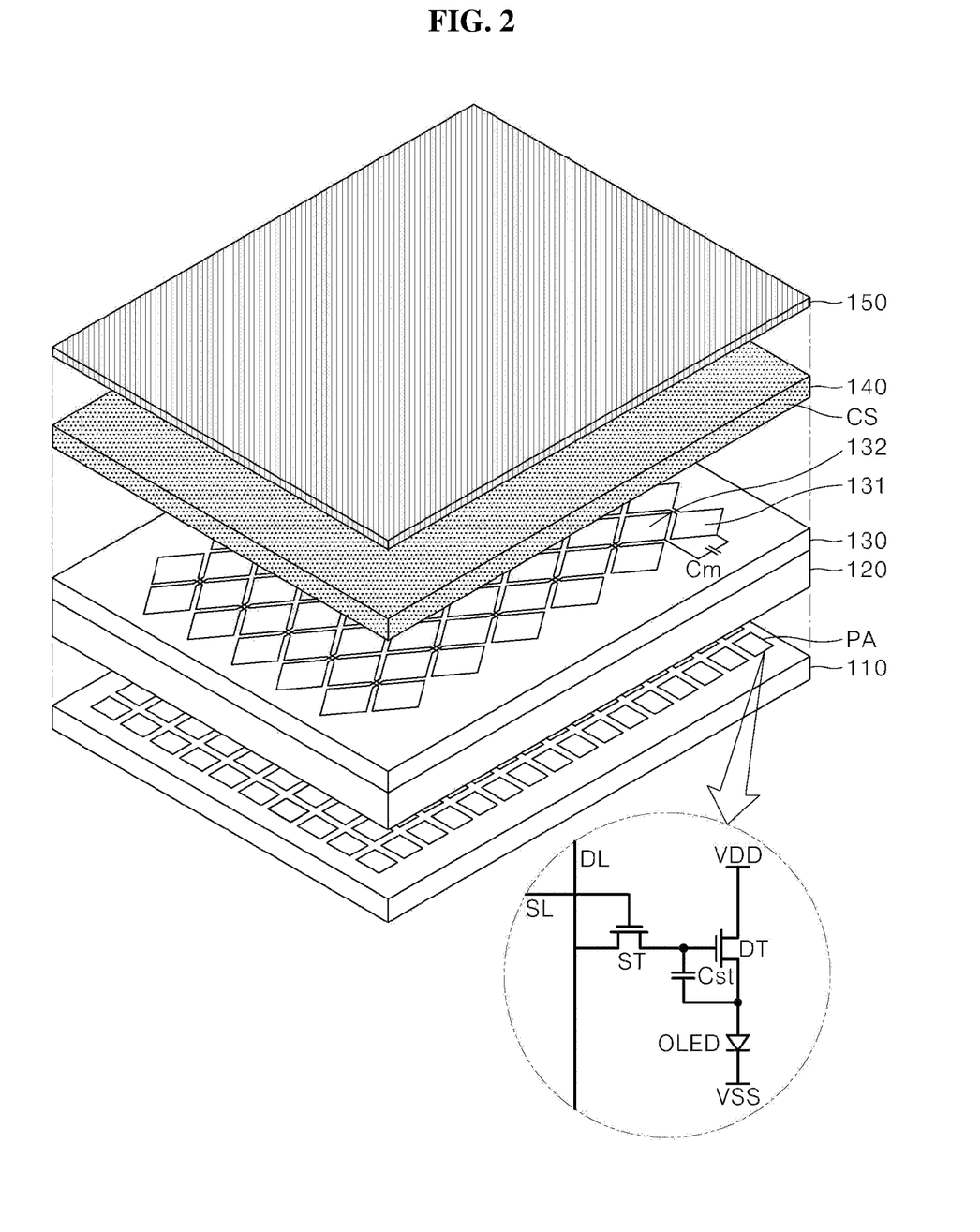
FIG. 2 shows a display panel of FIG. 1.
Figure 3:
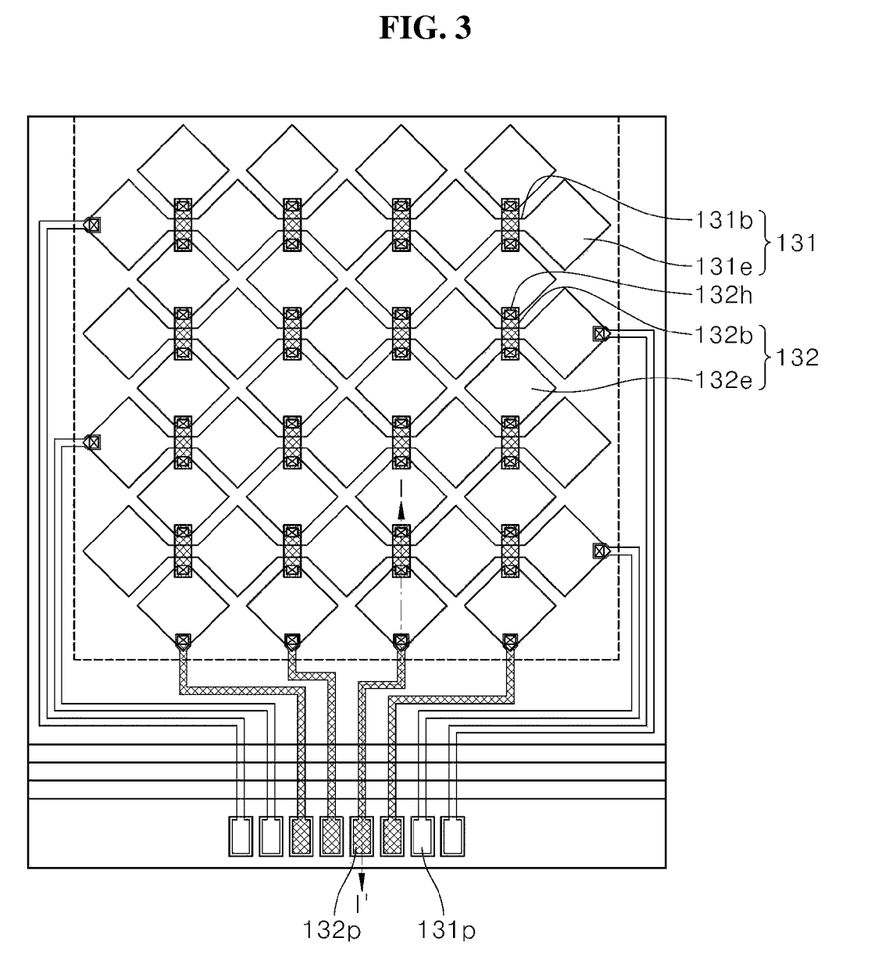
FIG. 3 shows an example of a top face of a touch sensor of FIG. 2.
Figure 4:
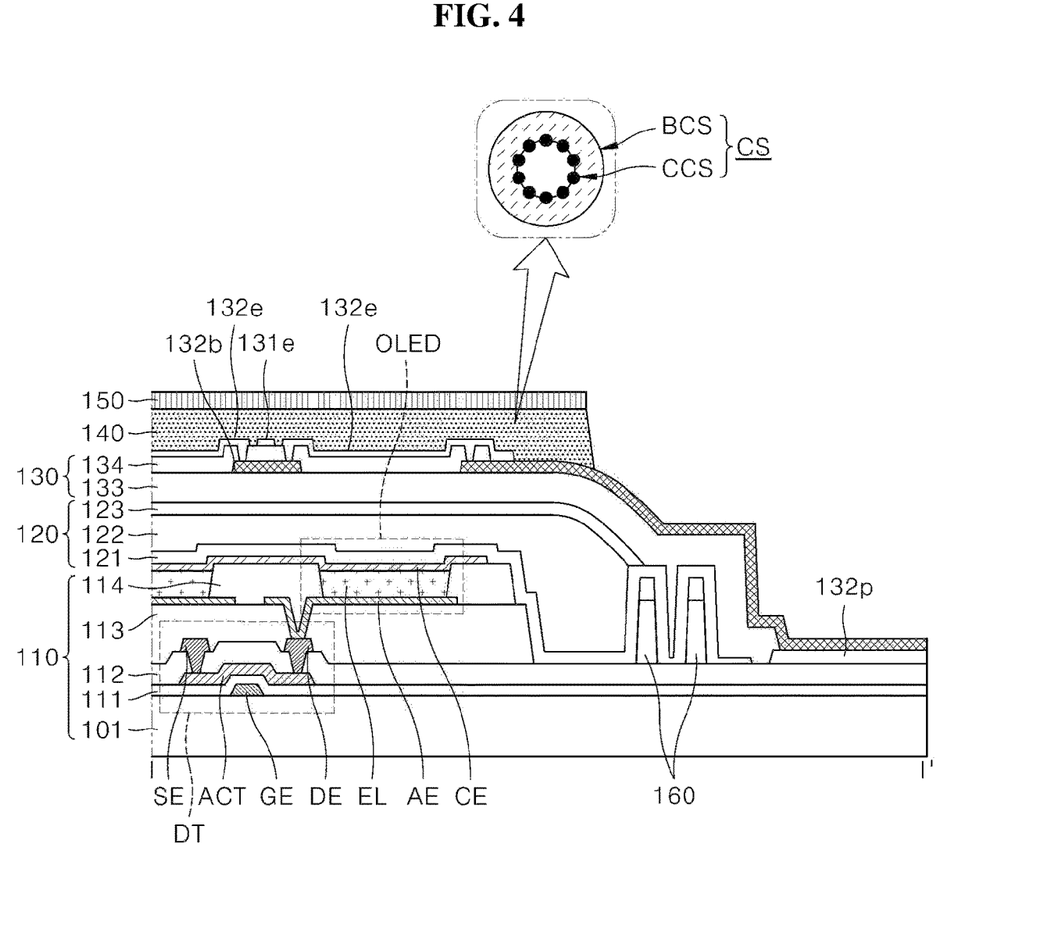
FIG. 4 shows an example of a cross-section taken along I-I' line in FIG. 3.

FIG. 1 shows an organic light-emission display device according to one aspect of the present disclosure. FIG. 2 shows a display panel of FIG. 1. FIG. 3 shows an example of a top face of a touch sensor of FIG. 2. FIG. 4 shows an example of a cross-section taken along I-I' line in FIG. 3.

As shown in FIG. 1, an organic light-emission display device 10 according to an aspect of the present disclosure includes a display panel 100 including a display region AA in which an image is displayed, and a circuit board 200 connected to the display panel 100 for supplying a control signal and power for driving the display panel 100.

The display panel 100 further includes a pad region, which is disposed in a portion of a non-display region outside the display region AA. The circuit board 200 is connected to the pad region.

As shown in FIG. 2, the display panel 100 includes a light-emission element array 110, an encapsulating film 120 covering the light-emission elements array 110, a touch sensor 130 disposed above the encapsulating film 120, a touch protective film 140 covering the touch sensor 130 and comprising a material containing core-shell structured particles CS, and a polarization film 150 disposed above the touch protective film 140.

The light-emission elements array 110 includes a plurality of light-emission elements OLEDs corresponding to a plurality of pixel regions PA arranged in the display region AA.

The light-emission elements array 110 may further include at least one thin film transistor DT and ST corresponding to each pixel region PA and supplying a driving current to each light-emission element OLED.

In one example, each pixel region PA of the light-emission elements array 110 includes an organic light-emission element OLED, a driving transistor DT connected in series to the organic light-emission element OLED, wherein the DT and OLED are disposed between a first driving power supply line VDD and a second driving power supply line VSS, and a switching transistor ST arranged between a gate electrode of the driving transistor DT and a data line DL. Each pixel region PA may further include a storage capacitor Cst disposed between the gate electrode of the driving transistor DT and an anode of the organic light-emitting element OLED.

When the switching transistor ST is turned on based on a scan signal from a scan line SL, the switching transistor ST transfers a data signal from the data line DL to the gate electrode of the driving transistor DT and the storage capacitor Cst. In this connection, when the driving transistor DT is turned on based on an output of the switching transistor ST and a charging voltage of the storage capacitor Cst, the organic light-emission element OLED is supplied with driving current.

The pixel regions PA may correspond to red R, green G, and blue B colors respectively. Alternatively, the pixel region PA may correspond to red R, green G, blue B, and white W colors respectively. For this purpose, each organic light-emitting element OLED of the light-emission elements array 110 may be configured to emits light corresponding to a corresponding color. Alternatively, a plurality of organic light-emission elements OLEDs included in the light-emission elements array 110 may be configured for emitting the same color. In this case, the display panel 100 may further include a color filter array (not shown) for rendering a color corresponding to each pixel region PA.

The organic light-emitting element (OLED) may be easily degraded due to moisture or oxygen. Thus, in order to delay the deterioration of the organic light-emission element (OLED), it is necessary to block penetration of moisture or oxygen into the organic light-emission element (OLED). Accordingly, the display panel 100 includes an encapsulating film 120 covering the light-emission elements array 110.

The encapsulating film 120 may have a structure in which at least two insulating films of different compositions or different thicknesses are stacked vertically.

The touch sensor 130 is disposed above the encapsulating film 120. First and second touch electrodes 131 and 132 extending in mutually intersecting directions are included in the touch sensor 130.

When a touch occurs in a certain region of the display region AA, electrostatic capacitance Cm between the adjacent first and second touch electrodes 131 and 132 in the touch sensor 130 may vary. Thus, the certain region where the touch occurs may be detected based on change of the capacitance Cm.

The display panel 100 includes a touch protective film 140 covering the touch sensor 130 to protect the touch sensor 130 from external electrical or physical impact.

According to one aspect of the present disclosure, the touch protective film 140 comprises a material containing core-shell structured particles CS to improve light extraction efficiency of the display panel 100. The core-shell structured particles CS are described in detail below with reference to FIG. 4.

The polarization film 150 is disposed above the touch protective film 140. In this connection, the polarization film 150 is to prevent reflection of external light. For easy fixing of the polarization film 150 to the film 140, the touch protective film 140 may comprise a sticky material.

Referring to FIG. 3, the touch sensor 130 includes a plurality of first touch electrodes 131, each extending in a first direction, which is a left-to-right direction in FIG. 3 and a plurality of second touch electrodes 132, each extending in a second direction perpendicular to the first direction. That is, the second direction is an up-to-down direction in FIG. 3.

Each first touch electrode 131 includes a plurality of first electrode patterns 131e arranged in the first direction, and a plurality of first bridges 131b, each bridge connecting first electrode patterns 131e neighboring with each other in the first direction.

Each second touch electrode 132 includes a plurality of second electrode patterns 132e arranged in the second direction and a plurality of second bridges 132b, each bridge connecting second electrode patterns 132e adjacent to each other in the second direction.

In this connection, the first bridge 131b may be disposed in the same layer as the first electrode pattern 131e. The second bridge 132b may be disposed in a different layer than that of the second electrode pattern 132e. In this case, the second bridge 132b may be connected to the second electrode pattern 132e via a contact hole 132h passing through an insulating film between the second bridge 132b and the second electrode pattern 132e.

Further, each of the plurality of first touch electrodes 131 may be connected to a first touch electrode pad 131p via a first touch link disposed outside the display region AA. In this connection, the first touch electrode pad 131p may be disposed in a pad region adjacent to one corner of the display region AA and outside the display region AA.

The first touch link may be located on the same layer as the second bridge 132b. In this case, the first touch link may be connected to the first touch electrode 131 via a contact hole.

Each of the plurality of second touch electrodes 132 may be connected to a second touch electrode pad 132p via a second touch link disposed outside the display region AA.

In this connection, as in the first touch electrode pad 131p, the second touch electrode pad 132p may be disposed in the pad region adjacent to one corner of the display region AA and outside the display region AA.

The second touch link may be located in the same layer as the second bridge 132b. In this case, the second touch link may be connected to the second touch electrode 132 via a contact hole.

As shown in FIG. 4, the display panel 100 according to an aspect of the present disclosure includes the array 110 of light-emission elements including a plurality of light-emission element (OLEDs) respectively corresponding to a plurality of pixel regions PA arranged in a display region AA, the encapsulating film 120 covering the light-emission elements array 110, the touch sensor 130 disposed above the encapsulating film 120, and the touch protective film 140 covering the touch sensor 130 and comprising a material containing core-shell structured particles CS.

The display panel 100 may further include the polarization film 150 as disposed above the touch protective film 140 and corresponding to the display region AA.

The light-emission element array 110 includes the driving transistor DT and the light-emission element OLED corresponding to each pixel region PA.

The driving transistor DT may include a gate electrode GE disposed above the substrate 101, and an active layer ACT disposed above a gate insulating film 111 covering the gate electrode GE, and a source electrode SE and a drain electrode DE disposed above a first interlayer insulating film 112 covering the active layer ACT.

In this connection, the active layer ACT may comprise an oxide semiconductor. The active layer ACT may include a channel region overlapping the gate electrode GE, and a source region and a drain region respectively disposed at both sides to the channel region.

The source electrode SE is connected to the source region of the active layer ACT via a contact hole passing through the first interlayer insulating film 112.

The drain electrode DE is connected to the drain region of the active layer ACT via a contact hole passing through the first interlayer insulating film 112.

This driving transistor DT is covered with a second interlayer insulating film 113.

Although the driving transistor DT is illustrated to have a bottom gate structure in FIG. 4, an aspect of the present disclosure is not limited thereto. The driving transistor DT may have a top gate structure or a double gate structure. Further, the driving transistor DT may include an active layer comprising a low temperature grown silicon semiconductor (LTPS) instead of an active layer ACT comprising an oxide semiconductor.

The light-emitting element OLED includes an anode AE disposed above the second interlayer insulating film 113, a cathode CE opposing the anode AE, and a light-emitting structure EL disposed between the anode AE and the cathode CE.

An edge of the anode AE may be covered with a bank insulating film 114.

The light-emitting structure EL may comprise an organic light-emitting material. In this case, the light emitting structure EL may include a hole transporting layer, a light emitting layer, and an electron transporting layer as sequentially stacked. In this connection, the hole transport layer is adjacent to the anode AE. The electron transport layer is adjacent to the cathode CE. Alternatively, the light emitting structure EL may further include at least one of a hole injection layer disposed between the hole transport layer and the anode AE, and an electron injection layer disposed between the electron transport layer and the cathode CE.

The light-emitting elements array 110 may be covered with the encapsulating film 120 to block moisture or oxygen penetration there into.

The encapsulating film 120 may have a structure in which a plurality of insulating films having different compositions or different thicknesses are stacked vertically.

In one example, the encapsulating film 120 may include a stack of a first encapsulating film 121 comprising an inorganic insulating material and covering the light-emitting elements array 110, a second encapsulating film 122 comprising an organic insulating material and disposed above the first encapsulating film 121, and a third encapsulating film 122 comprising an inorganic insulating material and disposed above the second encapsulating film 122.

In addition, the display panel 100 may further include a dam structure 160 disposed between the display region AA and the pad region.

The dam structure 160 prevents the encapsulating film 120 from collapsing in a region where the encapsulating film 120 is in contact with the substrate 101. For example, the dam structure 160 may include a stack of a first dam layer formed of the same layer as the second interlayer insulating film 113, and a second dam layer formed of the same layer as the bank insulating film 114.

The touch sensor 130 includes a touch buffer film 133 disposed above the encapsulating film 120 and a touch interlayer insulating film 134 disposed above the touch buffer film 133.

The touch sensor 130 includes a plurality of first touch electrodes 131 and a plurality of second touch electrodes 132, as described above with reference to FIG. 3. Each first touch electrode 131 includes the plurality of first electrode patterns 131e and the first bridges 131b, each connecting first electrode patterns 131e adjacent to each other in the first direction. Each second touch electrode 132 includes the plurality of second electrode patterns 132e and the second bridges 132b, each connecting second electrode patterns 132e adjacent to each other in the second direction.

As shown in FIG. 4, the first and second electrode patterns 131e and 132e and the first bridge 131b may be disposed above the touch interlayer insulating film 134.

The second bridge 132b may be disposed above the touch buffer film 133. In this connection, the second bridge 132b is covered with the touch interlayer insulating film 134 and is connected to the second electrode pattern 132e via a contact hole 132h passing through the touch interlayer insulating film 134.

Thus, the touch sensor 130 includes: the touch interlayer insulating film 134 disposed above the encapsulating film 120; the first touch electrode 131 including the plurality of first electrode patterns 131e disposed above the touch interlayer insulating film 134 and arranged in the first direction, and the first bridges 131b, each connecting first electrode patterns 131e neighboring with each other in the first direction; and the second touch electrode 132 including the plurality of second electrode patterns 132e arranged on the touch interlayer insulating film 134 and arranged in the second direction crossing the first direction and the second bridges 132b, each connecting the second electrode patterns 132e adjacent to each other in the second direction.

In this connection, the first bridge 131b may be disposed above the touch interlayer insulating film 134. The second bridge 132b may be disposed above the encapsulating film 120 and be covered with the touch interlayer insulating film 134. In one example, the second bridge 132b may be disposed above the touch buffer film 133. The second bridge 132b are connected to the second electrode pattern 132e via the contact hole 132h passing through the touch interlayer insulating film 134.

The touch sensor 130 is covered with the touch protective film 140.

The touch protective film 140 corresponds to at least the display region AA and covers the touch sensor 130. The touch protective film 140 comprises a material containing core-shell structured particles CS.

The touch protective film 140 may have a thickness of 2 µm.

Each of the core-shell structured particles CS has a core CCS comprising a metal oxide and a shell BCS comprising a molecular sieve surrounding the core CCS. Each of the core-shell structured particles CS may have a diameter of 4 nm to 6 nm.

In one example, the metal oxide of the core CCS may include an oxide containing Ti or Fe.

The molecular sieve of the shell BCS may comprise MCM-41 or SBA-15. In this connection, the molecular sieve has a hexagonal columnar structure.

In particular, when the shell BCS of each of the core-shell structured particles CS comprises the MCM material, a bulkiness of the touch protective film 140 increases, such that a packing density of the touch protective film 140 may be lowered.

In this connection, the MCM material may be Si-MCM-41 which may be synthesized by a hydrothermal process in which sodium methasilicate is used as a silica introduction material and cetyltrimethylammonium bromide is used as a surfactant.

The core-shell structured particles CS may be prepared by allowing the synthesized Si-MCM-41 carrying therein titanium oxide as a metal oxide. In this connection, a pore size of each of the core-shell structured particles CS may be controlled with treating using tetraethylortho silicate.

Further, the touch protective film 140 may further include at least one binder and a photo-sensitive agent. The touch protective film 140 may have adhesiveness due to the at least one binder.

In this connection, the binder may include at least one of an alkali developable binder and a silicon based binder. In particular, the binder may include silicone polymer. As the material of the touch protective film 140 includes the binder of the silicone polymer, this has an advantage that a heat resistance thereof may be higher than that of acrylic polymer which is a conventional material of the protective film. Further, since a Si—O bond of the silicone polymer has a higher bonding energy and thus a longer bond length than a C—C bond of the acrylic polymer, the touch protective film 140 becomes bulkier, such that the packing density of the touch protective film 140 may be lowered.

The photosensitive agent may include an oxime-based compound or a benzophenone-based compound. In particular, the photosensitive agent may include the benzophenone-based compound.

In one example, disposing of the touch protective film 140 may include: preparing a liquid material including a mixture between core-shell structured particles CS, an alkali developable binder or a silicon based binder, a photosensitive agent comprising an oxime based compound or a benzophenone based compound, and a predetermined solvent; applying the liquid material onto the touch sensor 130; and photocuring the liquid material on the touch sensor 130. In this connection, the solvent may be used to dissolve resin and may be PGMEA (propylene glycol monomethyl ether acetate). In the process of photocuring the liquid material, a firing temperature may be lower than 100° C., especially lower than 85° C. Limiting the firing temperature of the touch protective film 140 to be lower than 100° C. may allow damage to the light-emission elements array 110 due to the deposition process of the touch protective film 140 to be minimized. In this connection, the adhesion of the touch protective film 140 may be degraded due to the low temperature process performed at the firing temperature lower than 100° C. In order to prevent this degradation, the process of depositing the touch protective film 140 may further include a process of performing a light-exposure of an entire face of the photocured material after the process of photocuring the liquid material. This entire-face exposure process may allow the adhesive strength and curability of the touch protective film 140 to be improved.

Thus, since the touch protective film 140 comprises a material containing the core-shell structured particles CS, light emitted from the light-emitting elements array 110 may pass through the molecular sieve of the shell BCS having the hexagonal columnar shape to allow the light to have further enhanced straightness. The light transmittance of the touch protective film 140 may be improved due to the metal oxide of the core CCS having a relatively high refractive index. In one example, the refractive index of the metal oxide may be in a range of from about 2.6 to about 2.9.

Thus, due to the touch protective film 140 containing the core-shell structured particles CS, the light extraction ratio at which the light from the light-emission elements array 110 is emitted to the outside, that is, the light extraction efficiency may be improved.

Thus, a combination of placing the touch sensor 130 into the path along which the light from the light-emission elements array 110 is emitted to the outside and disposing the touch protective film 140 containing the core-shell structured particles CS on the touch sensor 130 may allow the light extraction efficiency to be further improved. Therefore, the luminance degradation due to the touch sensor 130 can be minimized. As a result, the display quality of the display panel 100 can be improved, and power consumption can be reduced.

The polarization film 150 is disposed above the touch protective film 140. In this connection, since the touch protective film 140 has adhesiveness due to the binder, an adhesive layer between the touch protective film 140 and the polarization film 150 may be removed. Therefore, the display panel 100 may be advantageously simplified and slim.

As described above, according to one aspect of the present disclosure, the touch protective film 140 covering the touch sensor 130 comprises the material containing the core-shell structured particles CS, the light extraction efficiency can be improved. As a result, the display quality can be improved and power consumption can be reduced.

The present disclosure as described above is not limited to the above-described aspect and the accompanying drawings. It will be apparent to those skilled in the art that various changes, substitutions, and alterations without departing from the spirit and scope of the present disclosure will be apparent to those skilled in the art to which the present disclosure pertains.

What is claimed is:
1. A display panel comprising:
a light-emission elements array including a plurality of light-emission elements which corresponds to a plurality of pixel regions arranged in a display region;
an encapsulating film covering the light-emission elements array;
a touch sensor disposed on the encapsulating film; and
a touch protective film disposed on the encapsulating film and covering the touch sensor,
wherein the touch sensor comprises:
a touch interlayer insulating film disposed on the encapsulating film;
a plurality of first touch electrodes extending in a first direction; and
a plurality of second touch electrodes extending in a second direction perpendicular to the first direction,
wherein each of the plurality of first touch electrodes is connected to a first touch electrode pad via a first touch link which is disposed outside the display region,
wherein each of the plurality of second touch electrodes is connected to a second touch electrode pad via a second touch link which is disposed outside the display region,
wherein a portion of each of the first touch link and the second touch link are disposed on a sloped surface of the encapsulating film, thereby having a sloped surface corresponding to the sloped surface of the encapsulating film, wherein each of the first touch link and the second touch link are partially covered by the touch protective film, and wherein the touch protective film includes a material containing core-shell structured particles.

2. The display panel of claim 1, wherein the core-shell structured particles include a core and a shell surrounding the core, wherein the core includes a metal oxide, and the shell includes a molecular sieve.

3. The display panel of claim 2, wherein the metal oxide includes an oxide containing Ti or Fe, wherein the molecular sieve includes MCM-41 or SBA-15.

4. The display panel of claim 1, wherein the material of the touch protective film includes at least one binder and a photosensitive agent.

5. The display panel of claim 4, wherein the at least one binder provides adhesiveness to the touch protective film.

6. The display panel of claim 4, wherein the at least one binder includes at least one of an alkali developable binder and a silicon based binder.

7. The display panel of claim 6, wherein the photosensitive agent includes an oxime compound or a benzophenone compound.

8. The display panel of claim 1, further comprising a polarizing film on the touch protective film and corresponding to the display region.

9. The display panel of claim 1, wherein the plurality of first touch electrodes comprises: a plurality of first electrode patterns disposed over the touch interlayer insulating film and arranged in the first direction; and a plurality of first bridges connecting the plurality of first electrode patterns in the first direction, wherein the plurality of first bridge is disposed over the touch interlayer insulating film.

10. The display panel of claim 1, wherein the plurality of second touch electrodes comprises: Response Under Non-final Office Action (F19-0425US001) a plurality of second electrode patterns disposed over the touch interlayer insulating film and spaced apart from the plurality of first electrode, and plurality of second electrode patterns arranged in the second direction; and a plurality of second bridges connecting the plurality of second electrode patterns adjacent to each other in the second direction, wherein the plurality of second bridge is disposed over the encapsulating film and is covered with the touch interlayer insulating film, and wherein the plurality of second bridge is connected to the plurality of second electrode patterns through a contact hole that passes through the touch interlayer insulating film.

11. A display panel comprising:
a light-emission elements array including a plurality of light-emission elements corresponding to a plurality of pixel regions arranged in a display region;
an encapsulating film disposed on the light-emission elements array;
a touch sensor disposed on the encapsulating film,
wherein the touch sensor comprises:
a touch interlayer insulating film disposed on the encapsulating film;
a plurality of first touch electrodes extending in a first direction; and
a plurality of second touch electrodes extending in a second direction perpendicular to the first direction; and
a touch protective film disposed on the encapsulating film and covering the touch sensor to prevent light emission loss through the touch sensor, wherein each of the plurality of first touch electrodes is connected to a first touch electrode pad via a first touch link which is disposed outside the display region, wherein each of the plurality of second touch electrodes is connected to a second touch electrode pad via a second touch link which is disposed outside the display region, wherein a portion of each of the first touch link and the second touch link are disposed on a sloped surface of the encapsulating film, thereby having a sloped surface corresponding to the sloped surface of the encapsulating film, wherein each of the first touch link and the second touch link are partially covered by the touch protective film, and wherein the touch protective film includes core-shell structured particles that have a core and a shell surrounding the core, and the core includes a metal oxide and the shell includes a molecular sieve.

12. The display panel of claim 11, wherein the metal oxide includes an oxide containing Ti or Fe, wherein the molecular sieve includes MCM-41 or SBA-15.

13. The display panel of claim 11, wherein the touch protective film includes at least one binder and a photosensitive agent.

14. The display panel of claim 13, wherein the at least one binder provides adhesiveness to the touch protective film.

15. The display panel of claim 13, wherein the at least one binder includes at least one of an alkali developable binder and a silicon based binder.

16. The display panel of claim 13, wherein the photosensitive agent includes an oxime compound or a benzophenone compound.

17. The display panel of claim 11, further comprising a polarizing film on the touch protective film and corresponding to the display region.

18. The display panel of claim 11, wherein the plurality of first touch electrodes comprises:
a plurality of first electrode patterns disposed above the touch interlayer insulating film and arranged in the first direction; and
a plurality of first bridges connecting the plurality of first electrode patterns in the first direction,
wherein the plurality of first bridge is disposed over the touch interlayer insulating film.

19. The display panel of claim 18, wherein the plurality of second touch electrodes comprises:
a plurality of second electrode patterns disposed over the touch interlayer insulating film and spaced apart from the plurality of first electrode, and plurality of second electrode patterns arranged in the second direction; and
a plurality of second bridges connecting the plurality of second electrode patterns adjacent to each other in the second direction,
wherein the plurality of second bridge is disposed over the encapsulating film and is covered with the touch interlayer insulating film, and
wherein the plurality of second bridge is connected to the plurality of second electrode patterns through a contact hole that passes through the touch interlayer insulating film.

* * * * *